United States Patent
Wu et al.

(10) Patent No.: US 7,654,309 B2
(45) Date of Patent: Feb. 2, 2010

(54) HEAT DISSIPATION DEVICE

(75) Inventors: Yi-Qiang Wu, Shenzhen (CN); Chun-Chi Chen, Tu Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 696 days.

(21) Appl. No.: 11/308,704

(22) Filed: Apr. 24, 2006

(65) Prior Publication Data

US 2007/0058342 A1      Mar. 15, 2007

(30) Foreign Application Priority Data

Sep. 12, 2005    (CN)    ................. 2005 1 0037284

(51) Int. Cl.
*H05K 7/20* (2006.01)
(52) U.S. Cl. ................ 165/80.3; 165/119; 165/121; 361/697
(58) Field of Classification Search ............. 165/80.3, 165/119, 122; 361/697
See application file for complete search history.

(56) References Cited

U.S. PATENT DOCUMENTS

| | | | | |
|---|---|---|---|---|
| 5,000,079 A | * | 3/1991 | Mardis | ............ 454/184 |
| 5,259,726 A | * | 11/1993 | Bacria | ............ 415/119 |
| 6,375,440 B2 | * | 4/2002 | Kosugi | ............ 417/423.14 |
| 6,392,885 B1 | * | 5/2002 | Lee et al. | ............ 361/697 |
| 6,464,578 B1 | * | 10/2002 | Chin et al. | ............ 454/184 |
| 6,749,398 B2 | | 6/2004 | Lu et al. | |
| 6,826,048 B1 | * | 11/2004 | Dean et al. | ............ 361/695 |
| 7,054,130 B2 | * | 5/2006 | Gorczyca et al. | ............ 361/231 |
| 7,178,583 B2 | * | 2/2007 | Huang | ............ 165/121 |
| 7,254,021 B2 | * | 8/2007 | Lee et al. | ............ 361/695 |
| 2004/0136160 A1 | * | 7/2004 | Lee et al. | ............ 361/697 |
| 2004/0191057 A1 | * | 9/2004 | Lee et al. | ............ 415/121.1 |
| 2005/0270740 A1 | * | 12/2005 | Tai et al. | ............ 361/690 |
| 2007/0089862 A1 | * | 4/2007 | Lu et al. | ............ 165/104.26 |

FOREIGN PATENT DOCUMENTS

| | | |
|---|---|---|
| CN | 2081056 U | 7/1991 |
| CN | 2310192 Y | 3/1999 |
| CN | 2426619 Y | 4/2001 |
| TW | 370217 | 9/1999 |
| TW | 431618 | 4/2001 |

* cited by examiner

*Primary Examiner*—Allen J Flanigan
(74) *Attorney, Agent, or Firm*—Frank R. Niranjan

(57) ABSTRACT

A heat dissipation device includes a heat sink (10), a fan (20) disposed on top of the heat sink, a fan duct (30) arranged on the fan and a fan guard (40) sandwiched between the fan and the fan duct. The fan defines a through hole (26) at each corner and includes a plurality of positioning blocks (28) extending from each side edge thereof. The fan duct includes a plurality of connecting portions (32) extending from a circumference of the fan duct near the fan. Each connecting portion includes a post fitted in the through hole and a hook engaging with the positioning block.

16 Claims, 3 Drawing Sheets

HEAT DISSIPATION DEVICE

FIELD OF THE INVENTION

The present invention generally relates to a heat dissipation device for removing heat from electronic components and particularly to a heat dissipation device having a fan guard mounted on an air intake of a fan by a fan duct to protect the fan from damage during operation.

DESCRIPTION OF RELATED ART

With advancement of computer technology, electronic devices operate with high speeds. It is well known that the more rapidly an electronic device operates, the more heat it generates. If the heat is not dissipated quickly, the stability of operation of the electronic device will be impacted.

Generally, in order to ensure the normal running of an electronic device, a heat dissipation device is used to dissipate the heat generated by the electronic device. A conventional heat dissipation device includes a heat sink and a fan attached on a top of the heat sink to improve a heat-dissipation speed of the heat sink. The fan commonly includes an airflow inlet and an airflow outlet. The airflow outlet faces the heat sink and the airflow inlet faces a fan duct so that the airflow produced by the fan flows along a predetermined direction from the fan duct to the heat sink. However, the blades of the fan are exposed and rotate rapidly when the fan is operated. It is dangerous for an operator to touch such a fan, and wire leads in a computer enclosure may become tangled in the blades of the fan.

Therefore, a fan guard is often used on the fan to protect people or wire leads from contacting with the rotating blades of the fan. A conventional fan guard is fixed to a fan via screws extending through holes of the fan guard and screwed in screw holes defined in the fan. However, such installation of the fan guard to the fan is complex. During assembly, screws pass through the fan guard and the fan to screw the fan guard to the fan. During disassembly, it is time-consuming to unscrew the screws from the fan and the fan guard and separate the fan from the fan guard. Thus, a heat dissipation device with a fan guard under simple assembly is needed.

SUMMARY OF INVENTION

A heat dissipation device of a preferred embodiment of the present invention comprises a heat sink, a fan disposed on top of the heat sink, a fan duct arranged on the fan and a fan guard sandwiched between the fan and the fan duct. The fan defines a through hole at each corner thereof and comprises a plurality of positioning blocks extending from each side edge thereof. The fan duct comprises an outtake facing the fan and an intake opposite the outtake. The fan duct further comprises a plurality of connecting portions extending from a circumference of the fan duct adjacent to the outtake thereof. Each connecting portion comprises a post engaging in the through hole and a hook engaging with the positioning block. Accordingly, the fan guard is securely mounted on the fan by the fan duct.

Other advantages and novel features will become more apparent from the following detailed description of preferred embodiments when taken in conjunction with the accompanying drawings, in which:

DETAILED DESCRIPTION

Figure 1:
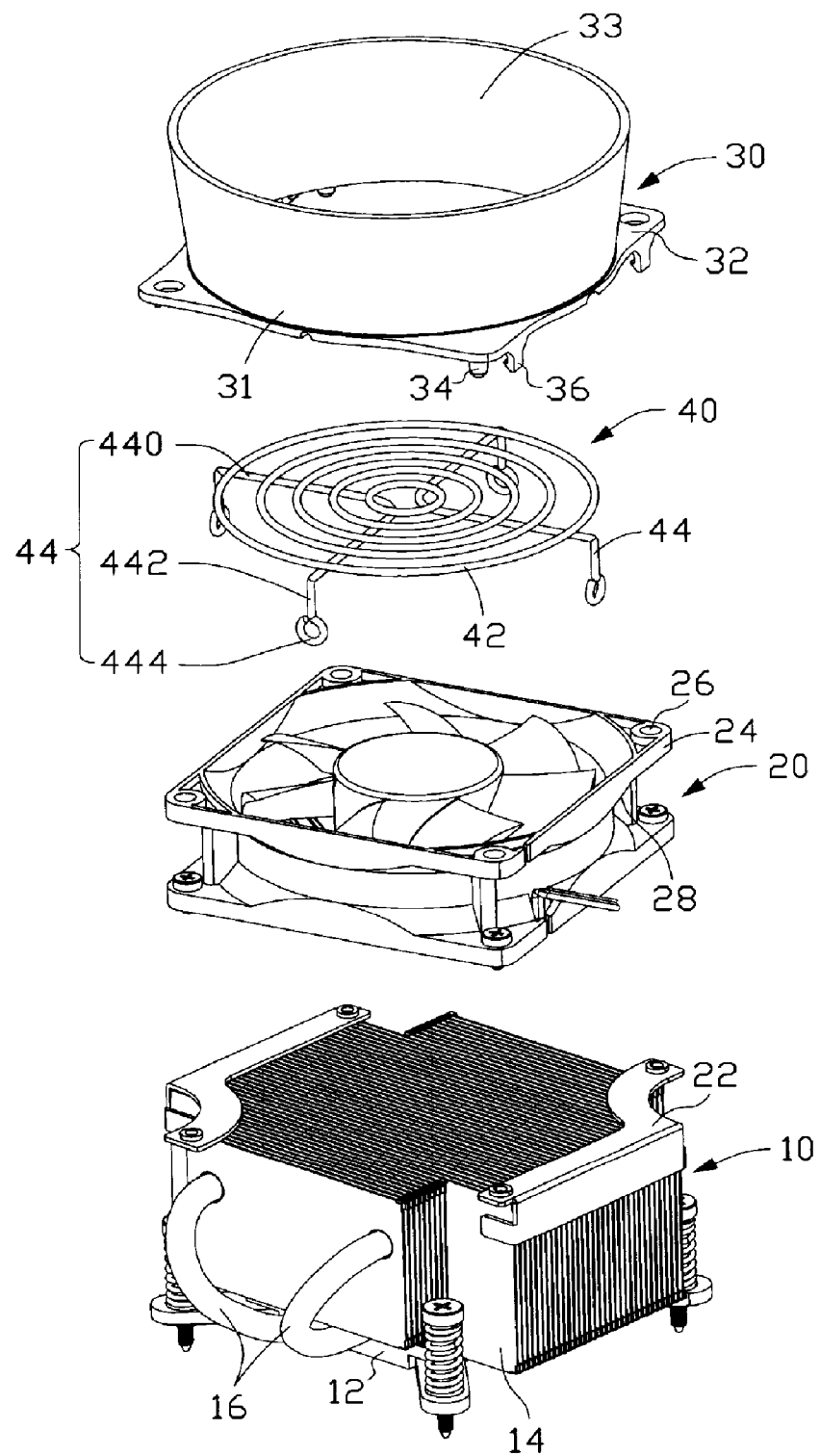
FIG. 1 is an isometric, exploded view of a heat dissipation device in accordance with the preferred embodiment of the present invention.
Figure 2:
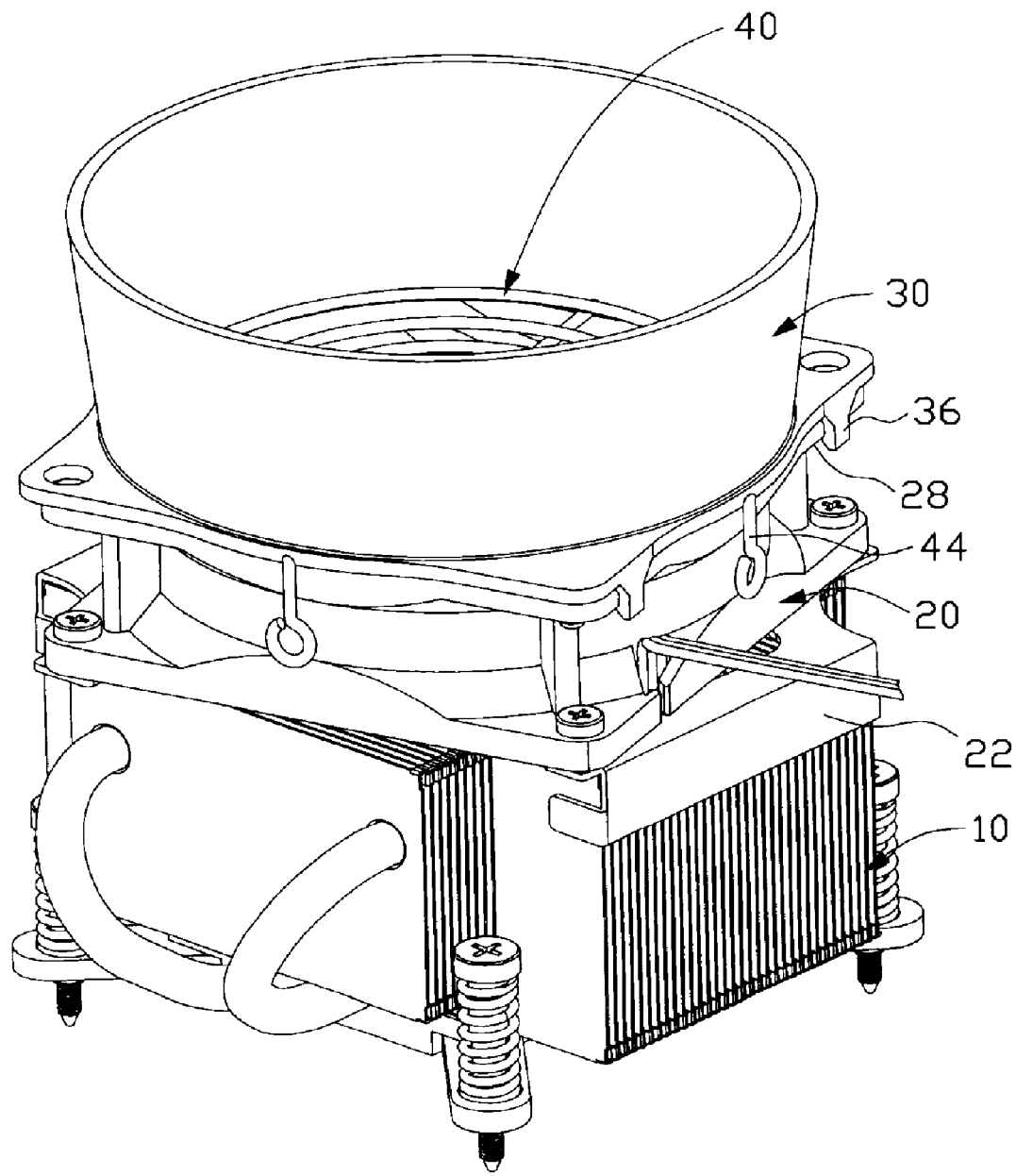
FIG. 2 is an assembled view of FIG. 1.

Referring to FIGS. 1-2, which show a heat dissipation device in accordance with a preferred embodiment of the present invention comprising a heat sink 10, a fan 20 disposed on a top of the heat sink 10, a fan duct 30 arranged on a top of the fan 20 and a fan guard 40 sandwiched between the fan 20 and the fan duct 30.

The heat sink 10 comprises a base 12, a plurality of fins 14 arranged on the base 12 and a pair of U-shaped heat pipes 16 connecting the base 12 and the fins 14.

The fan 20 is disposed on the heat sink 10 via a fan holder 22. The fan 20 has a quadrate frame 24 and the frame 24 defines a through hole 26 at each corner thereof. Four positioning blocks 28 extend downwards from four side edges of a top portion of the frame 24, respectively.

The fan duct 30 has a cylindrical configuration and comprises an outtake 31 and an intake 33. The outtake 31 is arranged facing an air intake (not labeled) of the fan 20 to lead airflow produced by the fan 20 along a predetermined direction from the fan duct 30 to the heat sink 10. Four connecting portions 32 extend outwardly from a circumference of the fan duct 30 adjacent the outtake 31. Each connecting portion 32 is attached on a top surface of the frame 24. A bottom of each connecting portion 32 downwardly forms a post 34 corresponding to the through hole 26 of the fan 20. A hook 36 adjacent to the post 34 extends inwardly from an edge of each connecting portion 32.

The fan guard 40 is made of metal wires and has a grill-like construction. The fan guard 40 comprises a plane 42 formed by a plurality of spaced and circular ribs and two pairs of supporters 44 connecting the circular ribs into a whole. Each supporter 44 has a supporting portion 440 attached to the circular ribs and connecting the circular ribs into a whole and a mounting leg 442 perpendicularly extending from an end of the supporting portion 440. An annular fastening foot 444 is formed at a distal, bottom end of each mounting leg 442. Four fastening feet 444 are symmetrically distributed along the circumference of the plane 42.

In operation, referring to FIG. 2, the fan is disposed on the top of the heat sink 10 via the fan holder 22 by extending four screws (not labeled) through four corners of a lower portion of the frame 24 and screwing the four screws into threaded holes (not labeled) defined in the fan holder 22. The fan guard 40 is then placed on the air intake of the fan 20 at a top of the fan 20. The fan duct 30 is arranged on a top of the fan guard 40 and the outtake 31 of the fan duct 30 faces the airflow intake of the fan 20. The posts 34 of the connecting portions 32 of the fan duct 30 are respectively inserted in the through holes 26. The fan duct 30 is downwardly pressed to make the hooks 36 catch the positioning blocks 28 of the fan 20. Then the heat sink 10, the fan 20, the fan guard 40 and the fan duct 30 are installed together. The fan guard 40 is sandwiched between the fan duct 30 and the fan 20 and securely fixed in position without any help of screws screwing through the fan guard 40 and the fan 20.

Figure 3:
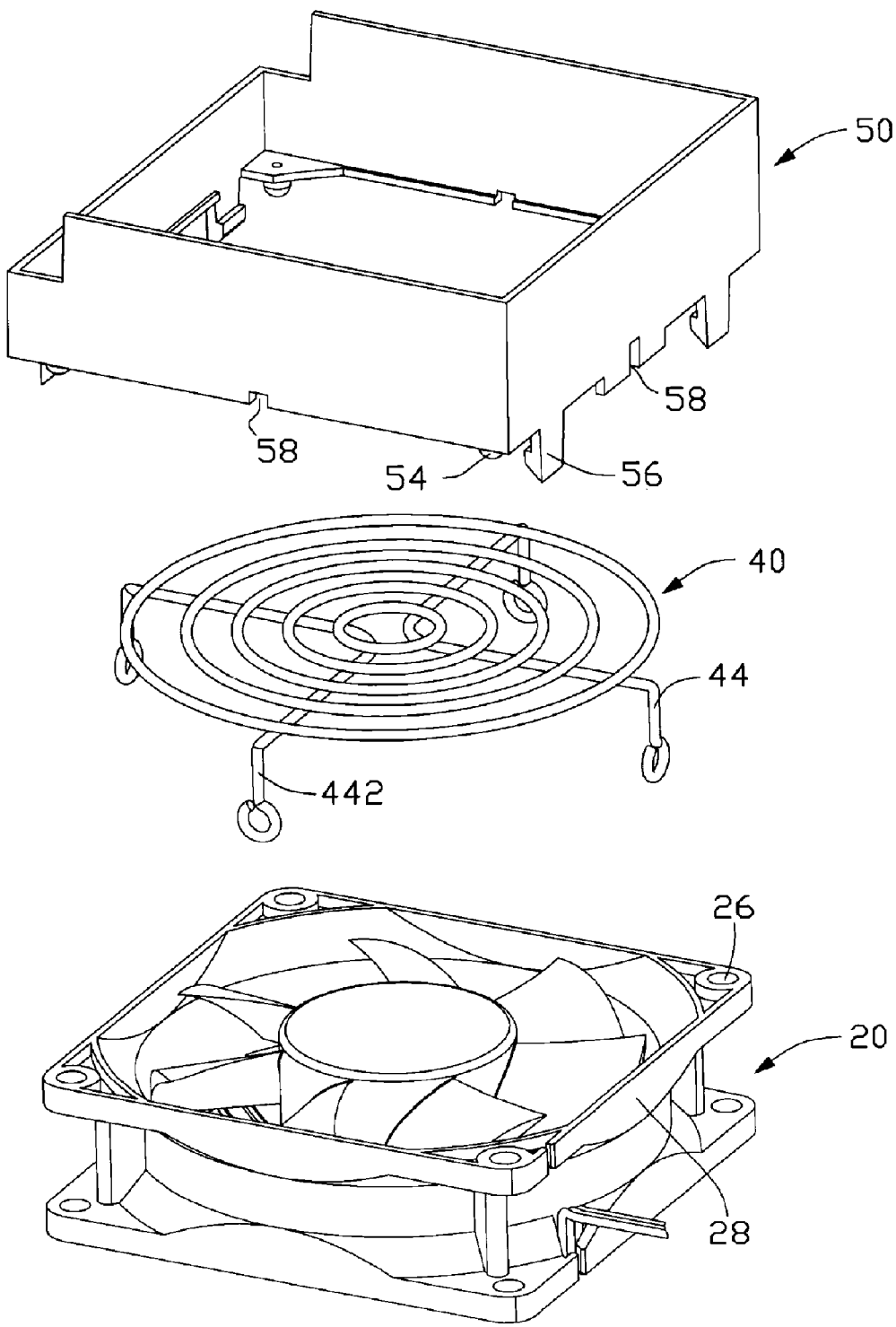
FIG. 3 is an isometric, exploded view of a heat dissipation device in accordance with another embodiment of the present invention.

Referring to FIG. 3, a heat dissipation device is shown in accordance with another embodiment of the present invention. The heat dissipation device of the second embodiment has a fan duct 50 with a square configuration distinct from the fan duct 30 with the cylindrical configuration in the first embodiment. Similar to the first embodiment, the fan duct 50 includes a post 54 and a hook 56 at each of four corners thereof. When assembled, the posts 54 are fitted into the holes 26 of the fan 20 and the hooks 56 engage the positioning blocks 28, whereby the fan guard 40 is securely sandwiched between the fan 20 and the fan duct 50. A notch 58 is defined in an edge of each lateral side of the fan duct 50, which allows the mounting legs 442 of the supporters 44 to pass through. When installing the fan duct 50 to the fan guard 40 and the fan 20, the mounting legs 442 are respectively passed through the notches 58 and mounted in the notches 58 to prevent the supporters 44 from turning along a circumference of the fan duct 50.

In the present invention, the fan guard 40 is sandwiched between the fan duct 30 (50) and the fan 20 in course of disposing the fan duct 30 (50) on the fan 20. An installation of the fan guard 40 being mounted onto the fan 20 is accomplished by the fan duct 30 (50) being mounted onto the fan 20. The fan guard 40 does not require any screws attaching the fan guard 40 onto the fan 20. Thus it simplifies the assembly course of the whole heat dissipation device and saves operating time. Furthermore, the fan guard 40 installed on the fan 20 avoids accidents and prevents damage to the fan 20.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
a heat sink;
a fan disposed on the heat sink;
a fan duct disposed on the fan, comprising an outtake, an intake opposite to the outtake, the outtake being attached on the fan, and a plurality of connecting portions extending from a periphery of the fan duct near the outtake, each connecting portion comprising a post and a hook engaging with the fan to mount the fan duct on the fan; and
a fan guard securely sandwiched between the fan and the fan duct;
wherein the fan duct has a square configuration and a notch is defined in an edge of each lateral side of the fan duct for the fan guard passing through.

2. The heat dissipation device as claimed in claim 1, wherein the fan comprises a frame and a plurality of positioning blocks extending from edges of a top portion of the frame to engage with the hooks.

3. The heat dissipation device as claimed in claim 2, wherein the frame of the fan defines a through hole at each corner thereof and the posts of the fan duct are respectively inserted in the through holes.

4. The heat dissipation device as claimed in claim 3, wherein the fan is disposed on a top of the heat sink and the fan duct is arranged at top of the fan.

5. The heat dissipation device as claimed in claim 4, wherein each post extends from a bottom of each connecting portion and the hook adjacent to the post extends from an edge of each connecting portion.

6. The heat dissipation device as claimed in claim 5, wherein the hooks respectively catch on the positioning blocks of the fan.

7. The heat dissipation device as claimed in claim 1, wherein the fan guard comprises a plane and a plurality of supporters mounted on the plane.

8. The heat dissipation device as claimed in claim 7, wherein each supporter comprises a supporting portion attached on the plane and a mounting leg perpendicularly extending from an end of the supporting portion.

9. The heat dissipation device as claimed in claim 8, wherein the mounting legs are symmetrically distributed along a circumference of the plane.

10. A heat dissipation device comprising:
a heat sink;
a fan disposed on a top portion of the heat sink, the fan forming a plurality of positioning blocks extending from edges thereof;
a fan guard disposed on a top of the fan; and
a fan duct attached on a top of the fan and forming a plurality of connecting portions from a periphery of the fan duct near the fan, each connecting portion comprising a post and a hook respectively engaging with the fan and a corresponding positioning block to mount the fan duct on the fan;
wherein the fan guard is clamped between the fan and the fan duct; and
wherein the fan duct has a square configuration and a notch is defined in an edge of each lateral side of the fan duct for the fan guard passing through.

11. The heat dissipation device as claimed in claim 10, wherein the fan defines a plurality of holes at each corner thereof to engage with the posts of the fan duct.

12. The heat dissipation device as claimed in claim 10, wherein the fan guard comprises a plane and a plurality of fastening feet extending from a peripheral edge of the plane.

13. The heat dissipation device as claimed in claim 12, wherein the fan guard further comprises a plurality of supporters mounted on the plane and the fastening feet are extended from ends of the supporters.

14. The heat dissipation device as claimed in claim 10, wherein the heat sink comprises a base, a plurality of fins arranged on the base and a pair of heat pipes connecting the base and the fins.

15. The heat dissipation device as claimed in claim 14, wherein the fan further comprises a fan holder mounting the fan on the heat sink.

16. A heat dissipation device comprising:
a heat sink;
a fan mounted on the heat sink;
a fan guard mounted on the fan; and
a fan duct mounted on the fan guard, and having a post inserted into the fan and a hook engaging with the fan thereby securely mounting the fan guard on a top of the fan;
wherein the fan duct has a square configuration and a notch is defined in an edge of each lateral side of the fan duct for the fan guard passing through.

* * * * *

UNITED STATES PATENT AND TRADEMARK OFFICE
CERTIFICATE OF CORRECTION

PATENT NO.       : 7,654,309 B2
APPLICATION NO. : 11/308704
DATED            : February 2, 2010
INVENTOR(S)      : Wu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 954 days.

Signed and Sealed this

Twenty-third Day of November, 2010

David J. Kappos
*Director of the United States Patent and Trademark Office*